United States Patent [19]

Hashimoto

[11] Patent Number: 5,408,433
[45] Date of Patent: Apr. 18, 1995

[54] NONVOLATILE SEMICONDUCTOR MEMORY DEVICE

[75] Inventor: Kiyokazu Hashimoto, Tokyo, Japan

[73] Assignee: NEC Corporation, Tokyo, Japan

[21] Appl. No.: 317,601

[22] Filed: Sep. 29, 1994

[30] Foreign Application Priority Data

Oct. 6, 1993 [JP] Japan .................. 5-276108

[51] Int. Cl.⁶ .................. G11C 11/40
[52] U.S. Cl. .................. 365/189.07; 365/218; 365/185; 365/207
[58] Field of Search .................. 365/189.01, 189.07, 365/194, 218, 185, 207

[56] References Cited

U.S. PATENT DOCUMENTS 5,258,950 11/1993 Murashima .................. 365/189.07

Primary Examiner—Joseph A. Popek
Assistant Examiner—A. Zarabian
Attorney, Agent, or Firm—Whitham, Curtis, Whitham & McGinn

[57] ABSTRACT

A nonvolatile memory device wherein the detection output of a comparator detector remains stable without oscillating even when the output of a sense amplifier enters an Insensitive zone which is a detection disable region of the comparator detector. The nonvolatile semiconductor memory device includes a comparator detector for comparing the output of a sense amplifier with a reference value, a coincidence detection circuit for detecting that erasure of a memory cell has been completed, and a low-pass filter interposed between the output of the comparator detector and an input of the coincidence detection circuit. By selection of a suitable time constant of the low-pass filter, oscillation waveforms of the output of the comparator detector can be prevented from being transmitted to the coincidence detection circuit, and completion of erasure can be detected accurately by the coincidence detection circuit.

5 Claims, 12 Drawing Sheets

NONVOLATILE SEMICONDUCTOR MEMORY DEVICE

BACKGROUND OF THE INVENTION

1. Field of the Invention

This Invention relates to a nonvolatile semiconductor memory device, and more particularly to a nonvolatile semiconductor memory device which internally has a function of verifying whether or not writing or erasure has been performed completely.

2. Description of the Related Art

An electrically reloadable read only memory device (hereinafter referred to as EEPROM) has an erasure mode in which stored information in memory cells are erased, and particularly, a memory device which can be electrically reloaded in a flash (hereinafter referred to as flash EEPROM) generally has an automatic erasure function of erasing stored information by internal control.

In a flash EEPROM having an automatic erasure function, an erasure operation is divided into an erasure period in which a high voltage is applied to memory cells and a subsequent period in which it is verified whether or not the memory cells are read out after completion of the erasure period to verify whether or not the threshold levels of them have become lower than a preset value. During the erasure period, the flash EEPROM is controlled by pulses (erasure signal) of several ms to several hundreds ms generated internally therein, but during the verification period, the flash EEPROM is controlled by pulses (verify signal) of several hundreds ns to several tens is generated internally therein.

In particular, in an erasure operation, stored information of the memory cells is erased actually when the erasure signal is at a high ("H") level, and then, after the erasure signal changes to a low ("L") level and the verify signal changes to the "H" level, a read circuit is activated to effect verification. If the result of erasure is incomplete, then the erasure signal changes to the "H" level to effect erasure of the memory cells again, and thereafter, verification is performed again. Then, such erasure of the memory cells is repeated until it is determined as a result of verification that erasure has been performed completely.

FIG. 7 schematically shows a portion of a conventional flash EEPROM to which the present invention is directed. Referring to FIG. 7, the circuit portion shown has an external power source terminal CC, an external ground terminal GND, an external VPP power source terminal PP to which a voltage higher than the power source voltage is applied upon writing or erasure, and an output terminal 0 from which stored information is outputted externally.

The flash EEPROM includes memory cells $M_{11}$ to $M_{nm}$ having a floating gate structure and arranged in a matrix of m columns and n rows. N-channel enhancement type MOSFETs (Metal-Oxide Semiconductor Field Effect Transistors) (hereinafter referred to as NE-MOSFETs) $QY_1$ to $QY_m$ for selecting a Y address for the memory cells and connecting the drain of the thus selected memory cell to an an input node SC of a sense amplifier circuit SA, Y address lines $Y_1$ to $Y_m$ for designating a Y address for the memory cells, X address lines $X_1$ to $X_n$ for designating an X address for the memory cells, a signal line RD which provides, in a read mode in which stored information of the memory cells is read out and upon verification, the "H" level to activate associated circuits, another signal line Erase which provides the "H" level for an erasure period, and a further signal line Veri which provides the "H" level upon verification. The flash EEPROM further includes the sense amplifier circuit SA, a reference circuit REF, a comparator detector DA for comparing the voltage of the output SO of the sense amplifier circuit SA with the voltage of the output RO of the reference circuit REF and amplifying a difference between the voltages, an output buffer circuit OUT for transmitting the output DO of the comparator detector DA to the output terminal O, and a coincidence detection circuit COMP for comparing the logic values of the output DO of the comparator detector DA and a signal DATA with each other to detect whether or not erasure of a memory cell has been completed.

The coincidence detection circuit COMP is controlled by the signal Veri such that it is activated when the signal Veri changes, upon verification, to the "H" level so that the logic values of the output DO and the signal DATA are compared with each other. When the logic values coincide with each other, the coincidence detection circuit COMP outputs, for example, the "L" level at the output CO thereof, but when the logic values do not coincide with each other, the coincidence detection circuit COMP outputs the "H" level.

The output CO is inputted to a circuit (not shown) which determines whether not erasure should be ended finally. The circuit fetches data of the output CO at a certain timing, and if the level of the output CO is the "L" level, it determines that the memory cells have been erased completely and ends the erasure, but if the level of the output CO Is the "H" level, then it determines that the memory cells have not been erased completely and accordingly generates an erasure signal again. Consequently, another erasure period is started to effect erasure of the memory cells.

A source switch circuit SW sets a potential to a source line CS common to the memory cells. When the erasure period signal Erase changes to the "H" level, the source switch circuit SW is activated so that a high voltage is applied to the source line CS. Consequently, all of the memory cells connected to the source line CS are erased. On the other hand, in a read mode or upon verification, the source switch circuit SW sets the potential to the source line CS to zero volt.

A parasitic inductance component $L_{cc}$ originating from leads of a package is present between the external power source terminal CC and an internal power source line, and a similar parasitic inductance component $L_{ss}$ is present between the external ground terminal GND and an internal grounding line. Resistors shown in FIG. 7 are parasitic resistance components originating from resistances of aluminum lines of the individual circuits wired to the power source and the ground. Further, a capacitance component Ce originating from a capacitance of a diffused layer and so forth appears between the internal power source and the ground. When those components need originally be represented in a distributed constant network, they are shown as seen in FIG. 7 for simplified illustration.

An actual flash EEPROM includes, where it has an 8-bit output configuration, eight such circuits as shown in FIG. 7. However, only one such circuit is shown in FIG. 7 for simplified illustration.

Operation of the flash EEPROM upon erasure will be described below with reference to FIGS. 9 to 13. In the flash EEPROM, writing of all bits of the memory cells is performed In order to make the threshold levels of the memory cells uniform before erasure. In this instance, the threshold levels of the memory cells are raised to a sufficiently high voltage normally equal to or higher than 7 volts.

Thereafter, an erasure operation is started. In the erasure operation, a high voltage is applied to the source line CS common to the memory cells, whereupon electrons which were injected into the floating gates during the preceding writing operation, are discharged to the sources. Consequently, the threshold level of each memory cell drops in accordance with the extent of the erasure period.

FIG. 8 illustrates the variation of the threshold level $V_{TM}$ of a memory cell with respect to the integrated time $t_{pe}$ of the erasure period. Referring to FIG. 8, for example, after $t_{pe5}$ after application of a first erasure pulse, the threshold level of the memory cell varies to $V_{TM5}$, and then, verification is performed and it is determined that erasure is incomplete. Thus, after $t_{pe5}$, within which several erasure pulses are applied, the threshold level of the memory cell changes to $V_{TM4}$.

Upon verification, the individual memory cells are read by the sense amplifier circuit SA. It is assumed that, in the present example, a memory cell which has written information therein (that is, a memory cell from which information has not been erased completely) has "0" stored therein, and when the memory cell is read, the "H" level appears at the output DO of the comparator detector DA, whereas another cell which has been erased completely has "1" stored therein, and when the memory cell is read, the "L" level appears at the output DO of the comparator detector DA.

Upon verification, the flash EEPROM is generally controlled such that a voltage of approximately 4.0 volts is applied to a selected X address line (for example, $X_1$). This is because, in a read mode, a memory cell with which it is determined that information has been erased completely as a result of verification must be read stably within an allowable power source voltage range (from 4.5 volts to 5.5 volts).

The verification operation is performed reading out information of all of the memory cells from which information has been erased in a flash. In particular, the flash EEPROM includes an internal counter (not shown) for counting an address, and in the example of FIG. 7, it is determined from a count value of the counter whether or not erasure of all of the memory cells $M_{11}$ to $M_{nm}$ has been performed completely. If it is determined during such verification that erasure is incomplete, then the verification is stopped, and an erasure pulse is generated to perform another erasure operation. If is is finally determined that all of the memory cells have been erased completely, it is determined that the intended erasure is completed, and the erasure operation is ended.

FIG. 9 shows a curve K which illustrates the relationship of the electric current $I_{on}$(cell) flowing through a memory cell to the threshold level $V_{TM}$ of the memory cell upon verification and another curve L which illustrates the relationship the output voltage $V_{SO}$ of the sense amplifier SA to the current $I_{ON}$(cell).

When erasure of a memory cell proceeds, the threshold level $V_{TM}$ with respect to the erasure time exhibits such a variation as seen in FIG. 8, and as a result, the current flowing through the selected memory cell varies In accordance with the curve K in FIG. 9 and the output voltage $V_{SO}$ of the sense amplifier circuit SA varies in accordance with the curve L in FIG. 9.

For example, at the time when the integrated time of erasure is $t_{pe3}$, the memory cell has a threshold level $V_{TM}=V_{TM3}=3.5$ volts, and the current $I_{ON}$(cell) flowing through the memory cell then is given at a point $K_1$ as seen in FIG. 9, at which $I_{ON}$(cell)=10 μA. As a result, the output voltage $V_{SO}$ of the sense amplifier SA is given at a point $L_1$, at which $V_{SO1}=3.4$ volts.

When the erasure integrated time is $t_{pe1}$, the memory cell has a threshold level $V_{TM}=V_{TM1}=3.0$ volts, and in this instance, the current $I_{ON}$(cell) is given at a point $K_2$, at which $I_{ON}$(cell)=20 μA. As a result, the output voltage $V_{SO}$ of the sense amplifier circuit SA is given at a point $L_2$, at which $V_{SO2}=3.0$ volts.

In FIG. 9, the value represented by $V_{REF}$ indicates the output voltage of the reference circuit REF and provides a point for determination whether a selected memory cell should be considered to be in a written condition ("0") in which information is stored in the memory cell or in an erased condition ("1") in which no information is stored in the memory cell. In the example shown, the output voltage $V_{REF}$ is set to $V_{REF}=3.2$ volts.

It is to be noted that, in FIG. 9, reference character $A_1$ denotes a "1" detection region, $A_2$ a transition region (in which detection is impossible), and $A_3$ a "0" detection region.

FIG. 10 shows an exemplary construction of the comparator detector DA which compares the output voltage $V_{SO}$ of the sense amplifier SA and the output voltage $V_{REF}$ of the reference circuit REF with each other and amplifies a difference between them. FIG. 11 illustrates the input/output characteristic of the comparator detector DA. Referring to FIGS. 10 and 11, the comparator detector DA shown includes a pair of P-channel enhancement type MOSFETs (hereinafter referred to as PE-MOSFETs) $Q_{D1}$ and $Q_{D2}$, three NE-MOSFETs $Q_{D3}$, $Q_{D4}$ and $Q_{D5}$, and an inverter circuit INV. A signal line RD provides the "H" level in a read mode and upon verification, and the comparator detector DA is activated by the "H" level of the signal line RD.

The comparator detector DA is generally designed such that, when the output voltage $V_{SO}$ of the sense amplifier circuit SA becomes equal to the output voltage $V_{REF}$ of the reference circuit REF, that is, $V_{SO}=V_{REF}$, the voltage $V_{D1}$ at a node $D_1$ and the voltage $V_{D2}$ at another node $D_2$ become equal to each other and the value of the voltages then makes a logic threshold level of the inverter circuit INV. In other words, the logic threshold level of the comparator detector DA is given when $V_{SO}=V_{REF}$. Accordingly, ideally it is detected that a selected memory cell is in a written condition when the value of the output voltage $V_{SO}$ satisfies the following expression (1) whereas it is detected that the selected memory cell is in a completely erased condition when the value of the output voltage $V_{SO}$ satisfies the following expression (2):

$$V_{SO} > V_{REF} \tag{1}$$

$$V_{SO} < V_{REF} \tag{2}$$

In an actual flash EEPROM, however, since the parasitic Inductances $L_{cc}$ and $L_{ss}$, the parasitic capacitance between the power source and the ground and the parasitic resistance between a power source line and a grounding line are involved as seen from FIG. 7, noise originating from switching of a MOSFET and so forth is generated upon verification, and the comparator detector DA cannot have characteristics of ideal conditions represented by the expressions (1) and (2), but when the value of the output voltage $V_{SO}$ is in the proximity of the output voltage $V_{REF}$ as seen from FIG. 11, an output indefinite region is present in which the output DO of the comparator detector DA exhibits an oscillation condition.

Accordingly, actually it is detected that a selected memory cell is in a written condition when the value of the output voltage $V_{SO}$ satisfies the following expression (3) whereas it is detected that a selected memory cell is in an erased condition when the value of the output voltage $V_{SO}$ satisfies the following expression (4):

$$V_{SO} \geq V_{REF} + \alpha \tag{3}$$

$$V_{SO} \leq V_{REF} - \beta \tag{4}$$

where $\alpha$ and $\beta$ are noise margins of the output voltage $V_{SO}$ to the output voltage $V_{REF}$ necessary for the output DO to be detected as at the "H" level.

On the other hand, when the value of the output $V_{SO}$ satisfies the following expression (5), it is impossible to definitely determine the condition of the selected memory cell:

$$V_{REF} - \beta < V_{SO} < V_{REF} + \alpha \tag{5}$$

It is to be noted that the following description proceeds on the assumption that $\alpha = \beta = 0.2$ volts.

The conventional flash EEPROM performs its erasure operation in such a manner as described above, and as seen in FIG. 8, when the integrated time of the erasure period is $t_{pe3}$, the threshold level of the selected memory cell is $V_{TM} = V_{TM3} = 3.5$ volts, and when verification is performed then, the value of the output voltage $V_{SO}$ varies, as seen from FIG. 9, to $V_{SO} = V_{SO1} = 3.4$ volts. Thus, if $V_{REF} = 3.2$ volts, then the expression (3) is satisfied. Consequently, it is determined that erasure is not yet complete, and another erasure period is set to further erase the memory cell.

In this instance, when the integrated time of the erasure period comes to $t_{pe2}$, the threshold level $V_{TM}$ becomes $V_{TM} = V_{TM2} = 3.2$ volts. Thus, upon verification, the value of the electric current $I_{ON}$(cell) is obtained at a point $K_3$ of the curve K in FIG. 9, and the value of the output $V_{SO}$ is obtained at a point $L_3$ of the curve L in FIG. 9 and $V_{SO} = V_{SO3} = 3.15$ volts. In this instance, since the value of the output $V_{SO}$ satisfies the expression (5), as seen from the characteristic In FIG. 11, the value of the output $V_{SO}$ is within the output indefinite region and the output DO of the comparator detector DA enters such an oscillation condition as seen in FIG. 13(B).

It is to be noted that FIGS. 13(A) to 13(C) show output waveforms of the two components upon verification in an erasure operation where the integrated time $t_{pe}$ of the erasure period is in the ranges of $t_{pe} \leq t_{pe3}$, $t_{pe3} < t_{pe} < t_{pe1}$, and $t_{pe} \geq t_{pe1}$, respectively.

FIG. 12 shows an exemplary construction of the coincidence detection circuit COMP. Referring to FIG. 12, the coincidence detection circuit COMP includes PE-MOSFETs $Q_{C1}$, $Q_{C3}$, $Q_{C5}$, $Q_{C7}$, $Q_{C9}$ and $Q_{C11}$ and NE-MOSFETs $Q_{C2}$, $Q_{C4}$, $Q_{C6}$, $Q_{C8}$, $Q_{C10}$ and $Q_{C12}$, which cooperatively constitute an exclusive OR circuit. The coincidence detection circuit COMP is activated upon verification to logically exclusively OR the output DO of the comparator detector DA and the signal DATA.

Consequently, the voltage variation of the output CO directly reflects the voltage variation of the output DO, and when the value of the output $V_{SO}$ enters the output indefinite region, the output CO exhibits an oscillation condition as seen from FIG. 13(B) similarly to the output DO.

In this instance, if the circuit which determines whether or not erasure should be ended finally fetches the data of the output CO at the time $t_1$ in FIGS. 13(A) to 13(C), it will determine that the erasure should be ended since the level of the output CO is "L" although the logic value of the output CO is indefinite and the output is in an oscillation condition, and as a result, the erasure will be ended although erasure of the memory cell is not complete as yet. In other words, no erasure signal is generated, and the erasure operation for the memory cell is not performed any more.

As described above, in the present case, in order to allow it to be detected that a memory cell has been erased completely, the value of the output $V_{SO}$ must satisfy the expression (4), and if $V_{REF} = 3.2$ volts and $\beta = 0.2$ volts, then the output $V_{SO} \leq 3.0$ volts is necessary. Reading the value of the threshold level $V_{TM}$ corresponding to the output $V_{SO} \leq 3.0$ volts from FIG. 9, the threshold level $V_{TM} \leq 3.0$ volts is necessary. In other words, if the threshold level $V_{TM}$ of the memory cell is not $V_{TM} = V_{TMC} = 3.0$ volts or less upon verification after an erasure period, then it is not determined that the memory cell has been erased completely.

Since the value of the output $V_{SO}$ with which the comparator detector DA falls in the output indefinite region is obtained from the expression (5) as described above, in the present case, if $\alpha = \beta = 0.2$ volts and $V_{REF} = 3.2$ volts, then 3.0 volts $< V_{TM} < 3.4$ volts. Reading the value of the threshold level $V_{TM}$ corresponding to it from FIG. 9, 3.0 volts $< V_{TM} < 3.5$ volts. Thus, when the value of the threshold level $V_{TM}$ is within the range upon verification after an erasure period, the comparator detector DA cannot definitely determine whether stored information of the memory cell is "0" or "1", and the output DO of the comparator detector DA exhibits an oscillation condition. Consequently, also the output CO of the coincidence detection circuit COMP exhibits an oscillation condition, and if the data of the output CO are fetched at the position of $t_1$ In FIG. 13, then the erasure is ended.

In this instance, since the threshold level of the memory cell has not yet dropped below a preset value (in the present example, $V_{TM} = 3.0$ volts), even if stored information of the memory cell is read out in a read mode, the memory cell current $I_{ON}$(cell) is lower than its originally designed value. This results in reduction of the reading speed or disabling of information "0" stored originally in the memory cells, giving rise to a problem of malfunctioning of the flash EEPROM.

As described above, in a conventional flash EEPROM, when the threshold level of a memory cell is, upon verification after an erasure period in an erasure operation for the memory cell, within a transition region (detection disable region) in which it is indefinite whether a comparator detector detects information of the memory cell as "1" or "0", the output of the comparator detector exhibits oscillations, and since the output of the comparator detector is inputted directly to a coincidence detection circuit for detecting whether or not the erasure is completed, if the output of the comparator detector oscillates, also the output of the coincidence detection circuit oscillates. Accordingly, the conventional flash EEPROM has a problem in that, although erasure is not sufficient, such oscillation condition is determined to be completion of erasure and the erasure is ended in error.

Consequently, the reading speed in a read mode is retarded or stored information of memory cells cannot be read out correctly, and the reliability of the conventional flash EEPROM is not sufficiently high.

SUMMARY OF THE INVENTION

It is an object of the present invention to provide a nonvolatile memory device wherein the detection output of a comparator detector remains stable without oscillating even when the output of a sense amplifier enters an insensitive zone which is a detection disable region of the comparator detector.

In order to attain the object described above, according to the present invention, there is provided a nonvolatile semiconductor memory device, which comprises an electrically reloadable nonvolatile semiconductor memory element, sense amplifier means for reading and amplifying stored information of the memory element, comparison means for comparing an output level of the sense amplifier means with a reference level, low-pass filter means for receiving a comparison output of the comparison means as an input thereto, and coincidence detection means for comparing a filter output of the low-pass filter means with a predetermined logic value to detect a coincidence condition between them to detect a storage condition of information of the nonvolatile semiconductor memory element.

The nonvolatile semiconductor memory device may further comprise buffer means for leading out the output of the low-pass filter means to the outside of the nonvolatile semiconductor memory device.

Preferably, the low-pass filter means includes a delay circuit for delaying a variation of the comparison output of the comparison means inputted thereto. The delay circuit may include a first inverter for receiving the comparison output of the comparison means as an input thereto, a second inverter for receiving an output of the first inverter as an input thereto, and a capacitor provided at each of outputs of the first and second inverters. Alternatively, the delay circuit may be a time constant circuit which receives the comparison output of the comparison means as an input thereto and includes a resistor and a capacitor.

In the nonvolatile semiconductor memory device, in order to prevent a possible bad influence of oscillations of the comparison means which are generated when the threshold level of the memory cell is within a transition region (detection disable region) in which it is indefinite whether the comparison means detects, upon verification after an erasure period for erasure of the memory cell, stored information of the memory cell as "1" or "0", the low-pass filter means for preventing transmission of such oscillations therethrough is interposed between the output of the comparison means and the input of the coincidence detection means for detecting whether or not erasure of the memory cell has been completed. Consequently, oscillations of the output of the comparison means are not prevented from being transmitted to the input of the coincidence detection circuit by the low-pass filter means, and the coincidence detection circuit is not influenced, upon detection thereof, by such oscillations of the output of the comparison means.

Consequently, the problem of the conventional nonvolatile semiconductor memory device that oscillations of the output of the comparator detector are determined as completion of erasure in error is eliminated. Accordingly, the nonvolatile semiconductor memory device of the present invention is superior in reliability.

The above and other objects, features and advantages of the present invention will become apparent from the following description and the appended claims, taken in conjunction with the accompanying drawings in which like parts or elements are denoted by like reference characters.

DESCRIPTION OF THE PREFERRED EMBODIMENTS

Figure 1:
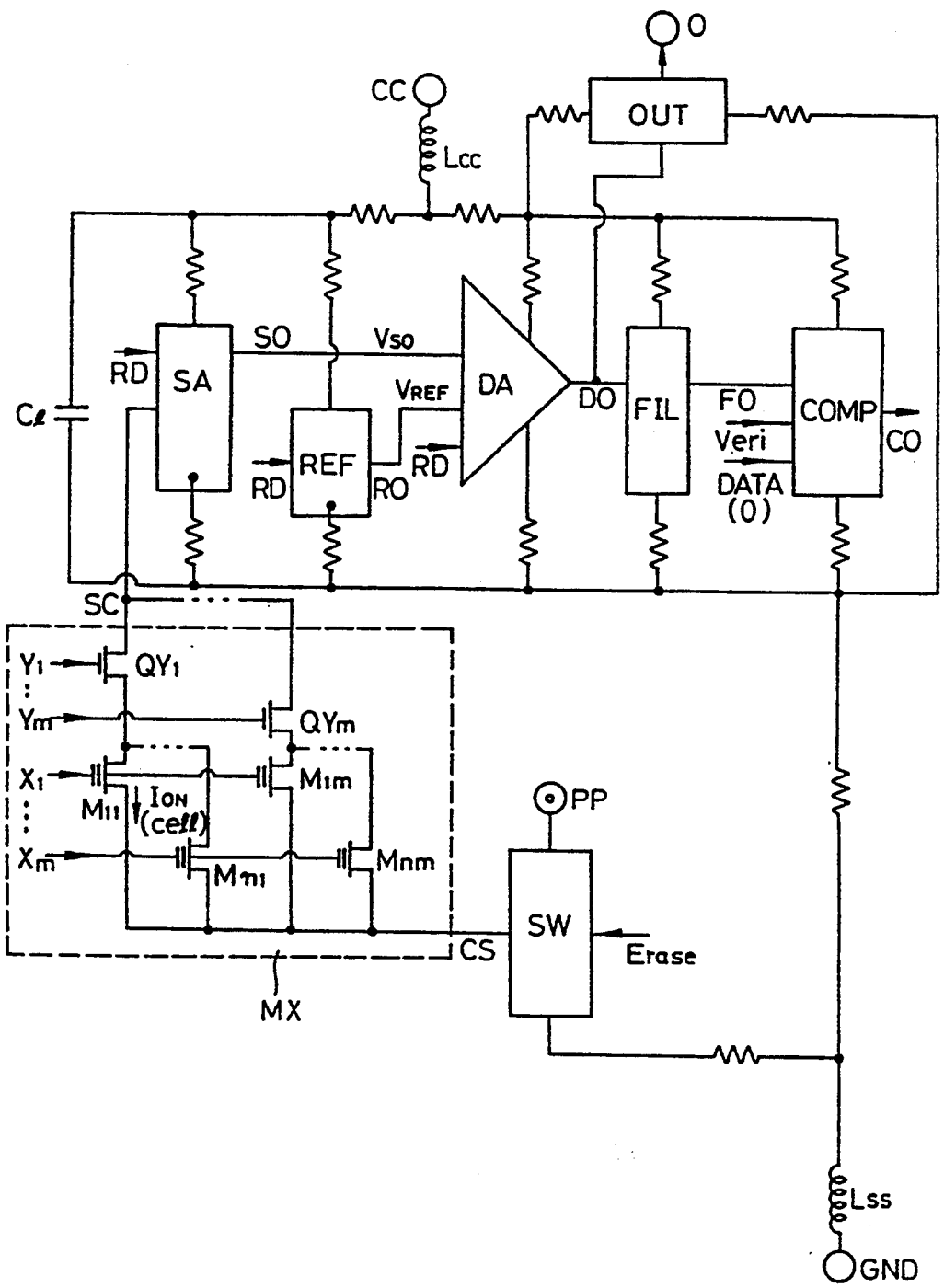
FIG. 1 is circuit block diagram of a nonvolatile semiconductor memory device showing a preferred embodiment of the present invention.
Figure 7:
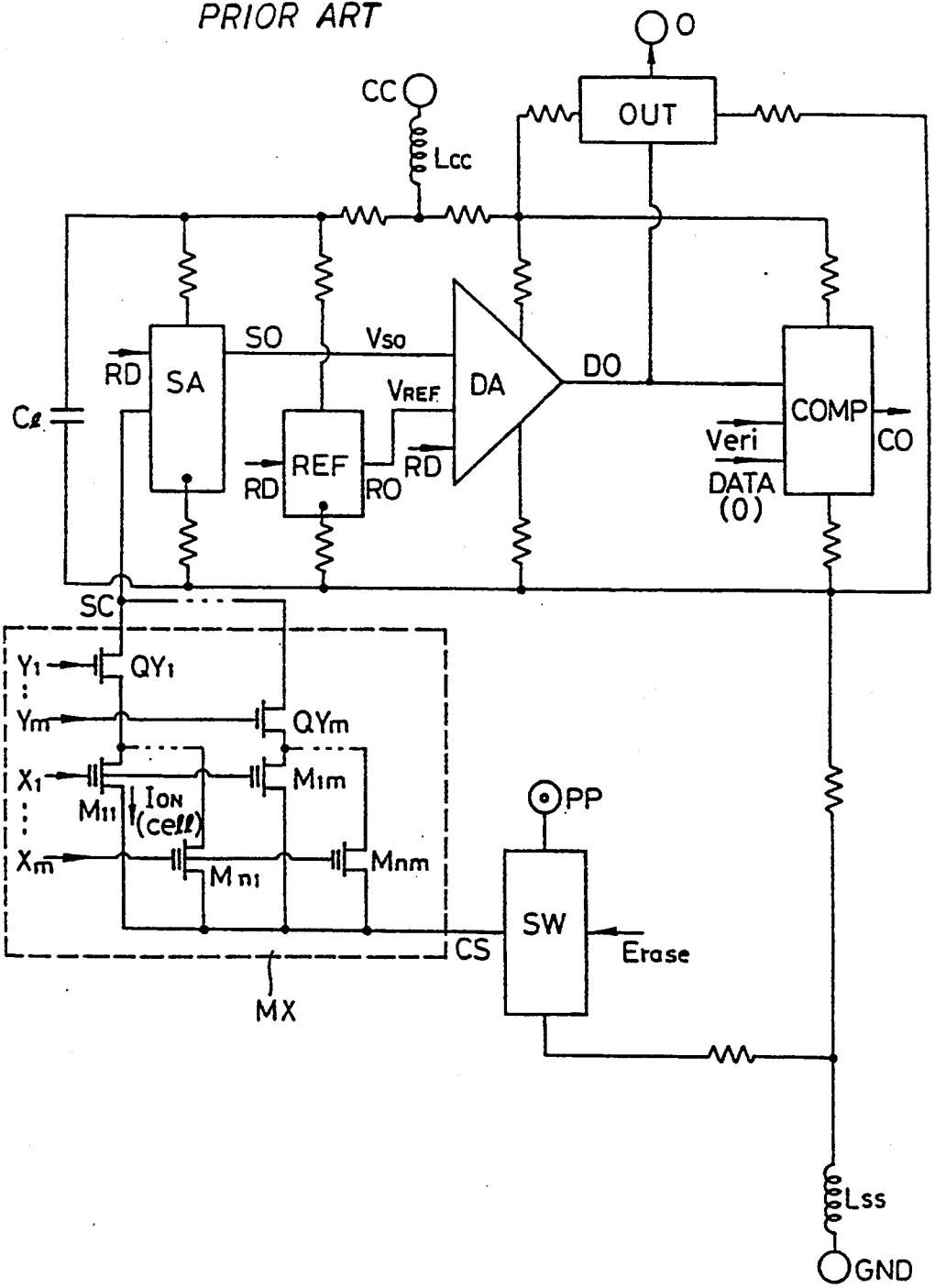
FIG. 7 is a circuit block diagram showing an exemplary conventional nonvolatile semiconductor memory device.

Referring first to FIG. 1, there is shown a nonvolatile semiconductor memory device in the form of a flash EEPROM according to a first preferred embodiment of the present Invention. The flash EEPROM is an improvement over and includes common components to those of the conventional flash EEPROM described hereinabove with reference to FIG. 7, and overlapping description of the common components is omitted herein to avoid redundancy.

The flash EEPROM in the present embodiment is different from the conventional flash EEPROM principally in that it additionally includes a filter circuit FIL interposed between the comparison circuit DA and the coincidence detection circuit COMP. The output DO of the comparator detector DA is inputted to the filter circuit FIL, and the output FO of the filter circuit FIL is inputted to the coincidence detection circuit COMP. The filter FIL has a function of preventing, when the output DO of the comparator detector DA oscillates, such oscillations from being transmitted to the coincidence detection circuit COMP at the next stage. More particularly, the filter FIL is designed so as to operate as a low-pass filter which removes oscillation signals having cycle times shorter than a certain fixed cycle time.

Figure 2A:
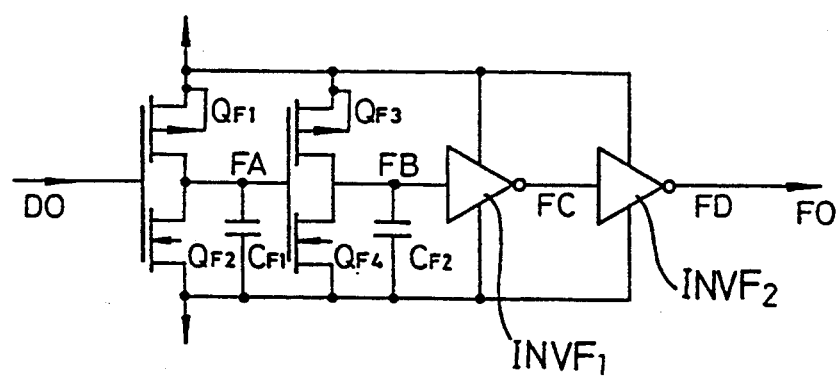
FIGS. 2(A) and 2(B) are circuit diagrams showing different exemplary constructions of a filter circuit of the nonvolatile semiconductor memory device shown in FIG. 1.

FIG. 2(A) shows a first example of the filter FIL. Referring to FIG. 2(A), the filter FIL shown includes a pair of PE-MOSFETs $Q_{F1}$ and $Q_{F3}$, a pair of NE-MOSFETs $Q_{F2}$ and $Q_{F4}$, a pair of capacitors $C_{F1}$ and $C_{F2}$ provided by gate capacitances and so forth, and a pair of inverter circuits $INVF_1$ and $INVF_2$.

In the filter FIL shown in FIG. 2(A), the current driving capacity of the NE-MOSFET $Q_{F2}$ is designed so as to be sufficiently higher than the current driving capacity of the PE-MOSFET $Q_{F1}$, and the current driving capacity of the PE-MOSFET $Q_{F3}$ is designed to be sufficiently higher than the current driving capacity of the NE-MOSFET $Q_{F4}$. Meanwhile, the equivalent resistance values of the MOSFETs $Q_{F1}$ and $Q_{F4}$ are designed to be comparatively high.

For example, the gate width/gate length (hereinafter referred to as W/L) of the PE-MOSFET $Q_{F1}$ is designed to be W/L=5/30; the W/L of the NE-MOSFET $Q_{F2}$ is designed to be W/L=5/1.2; the W/L of the PE-MOSFET $Q_{F3}$ is designed to be W/L=10/1.2; and the W/L of the NE-MOSFET $Q_{F4}$ is designed to be W/L=5/15.

An erasure operation of the flash EEPROM of the embodiment of the present invention will be described with reference to FIGS. 1 to 4. An erasure operation is divided, as described hereinabove in connection with the conventional flash EEPROM, into an erasure period and a verification period, and the signals and the operations of the components of the flash EEPROM of the present embodiment in an erasure period are quite similar to those described hereinabove in connection with the conventional flash EEPROM. Accordingly, description of the signals and the operations of the components in an erasure period is omitted herein to avoid redundancy. Further, since also the signals and the operations of the sense amplifier circuit SA and the reference circuit REF upon verification are quite similar to those described hereinabove in connection with the conventional flash EEPROM, overlapping description of them is omitted herein to avoid redundancy.

Figure 8:
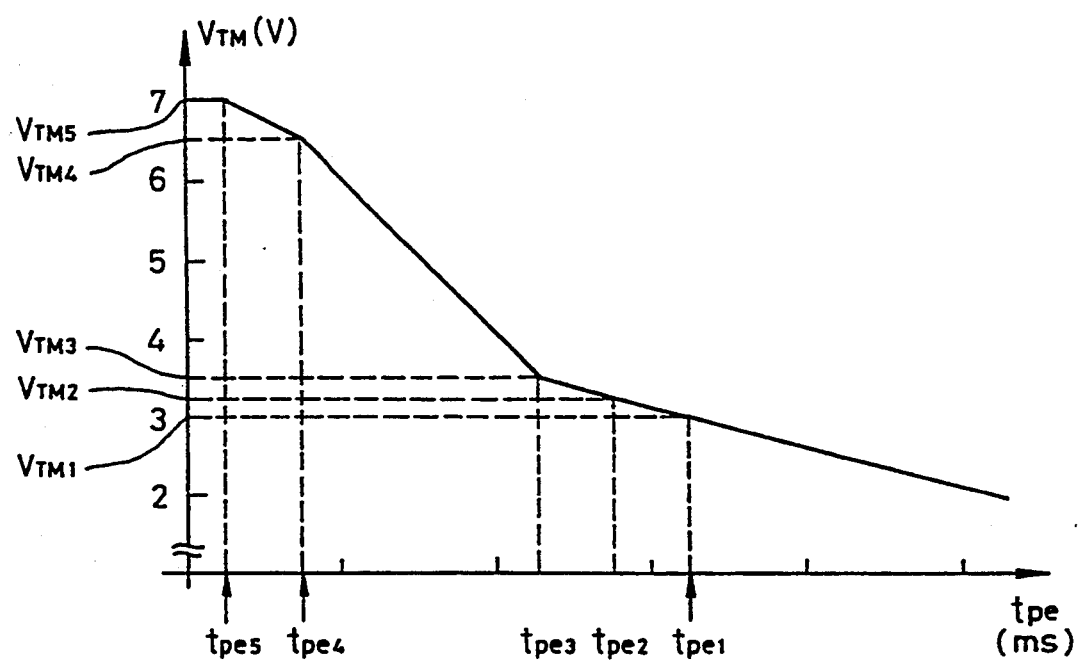
FIG. 8 is a diagram illustrating the variation of the threshold level of a memory cell with respect to an integrated time of an erasure period in the nonvolatile semiconductor memory device of FIG. 7.
Figure 9:
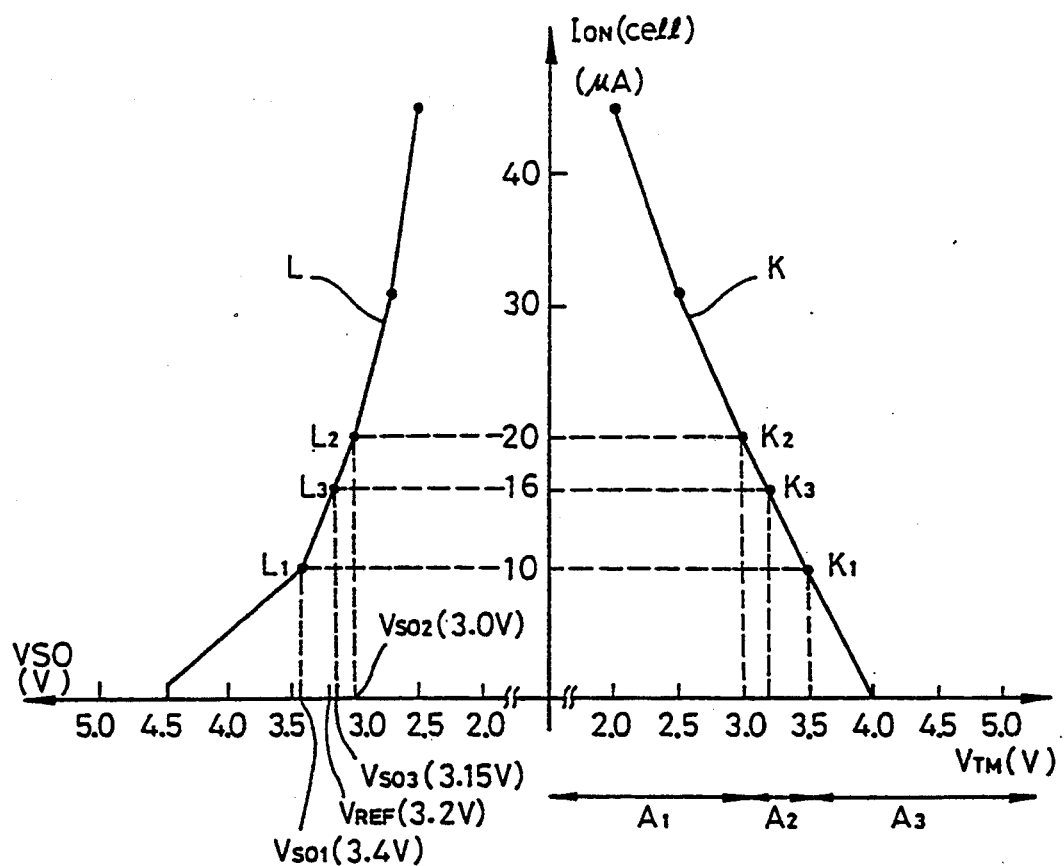
FIG. 9 is a diagram illustrating the relationships of an electric current flowing through a memory cell to the variation of the threshold level of the memory cell and of the output voltage of a sense amplifier to the electric current.
Figure 10:
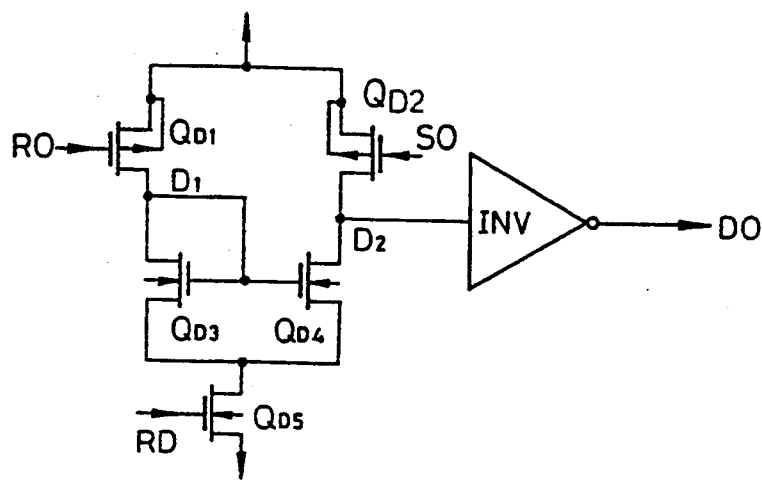
FIG. 10 is a circuit diagram showing an exemplary comparator detector.
Figure 11:
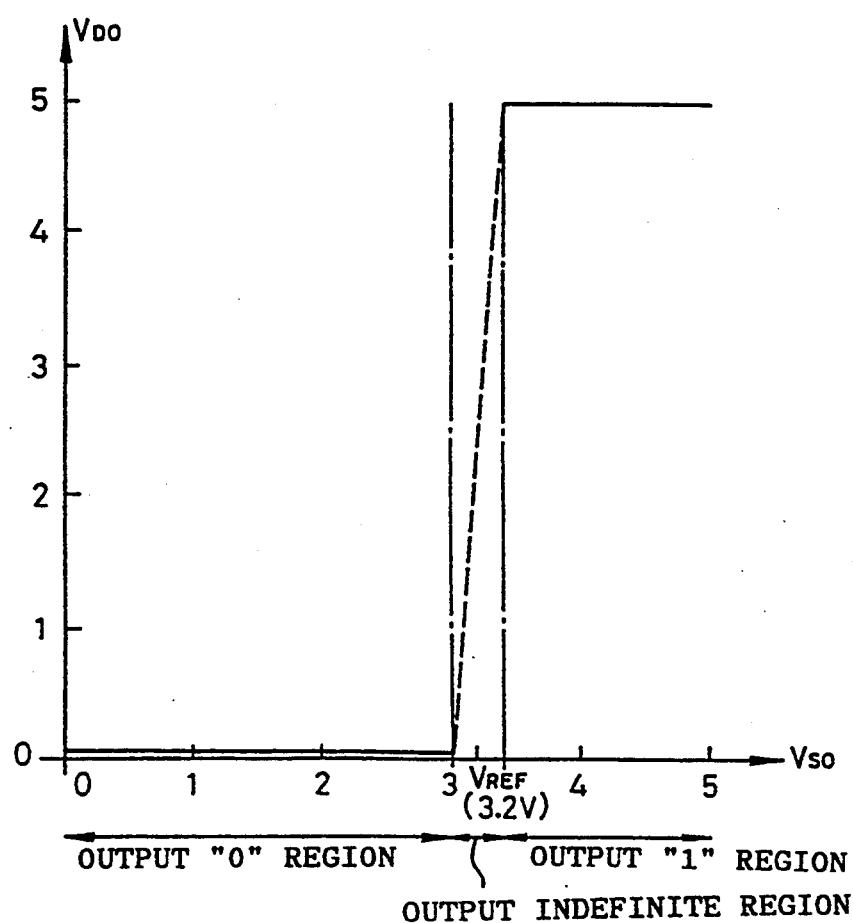
FIG. 11 is a characteristic diagram illustrating an input/output characteristic of the comparator detector shown in FIG. 10.
Figure 12:
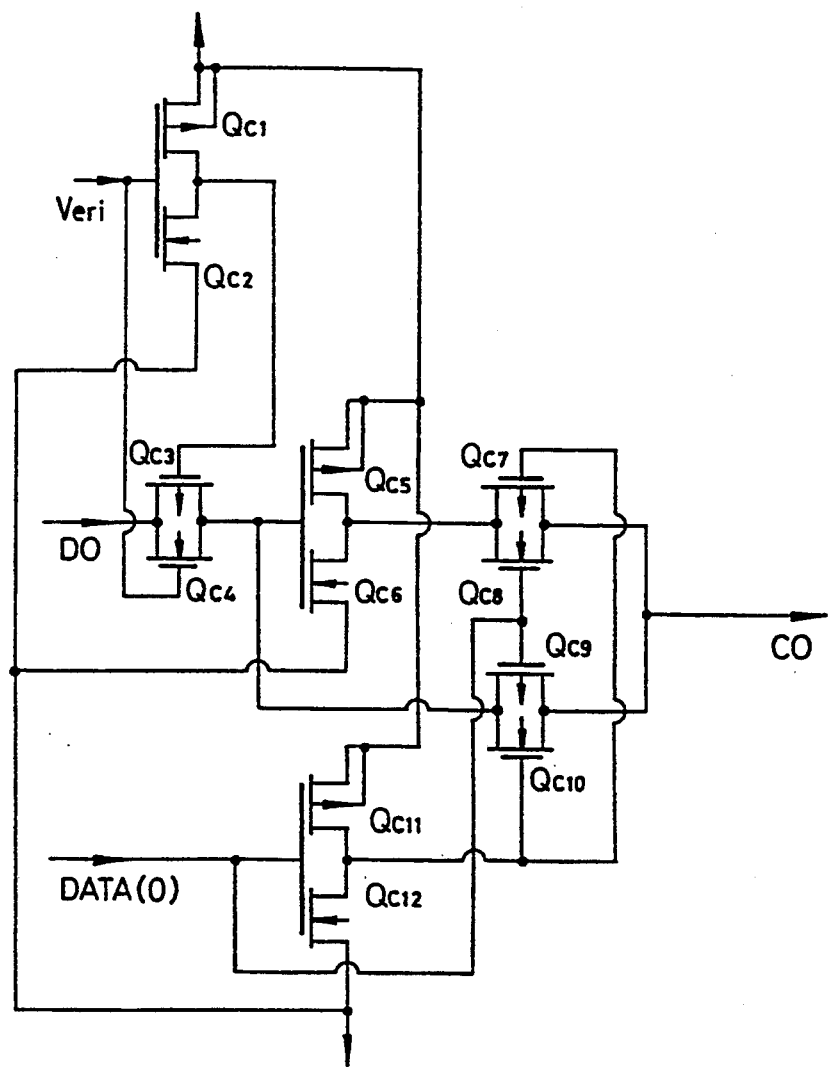
FIG. 12 is a circuit diagram showing an exemplary coincidence detection circuit.
Figure 13A:
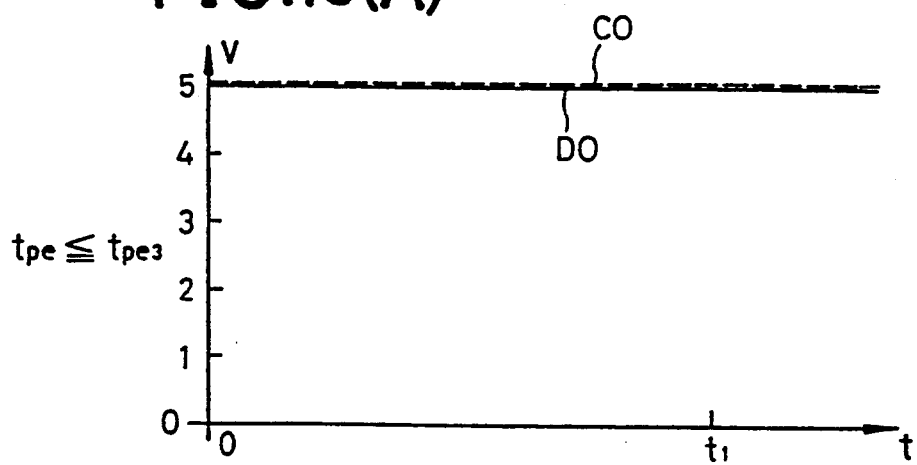
FIGS. 13(A), 13(B) and 13(C) are waveform diagrams of outputs of different nodes of the conventional nonvolatile memory device of FIG. 7 upon verification in an erasure operation when the integrated time $t_{pe}$ of an erasure period is $t_{pe} \geq t_{pe3}$, $t_{pe3} < t_{pe} < t_{pe1}$ and $t_{pe} \leq t_{pe1}$, respectively.
Figure 13B:
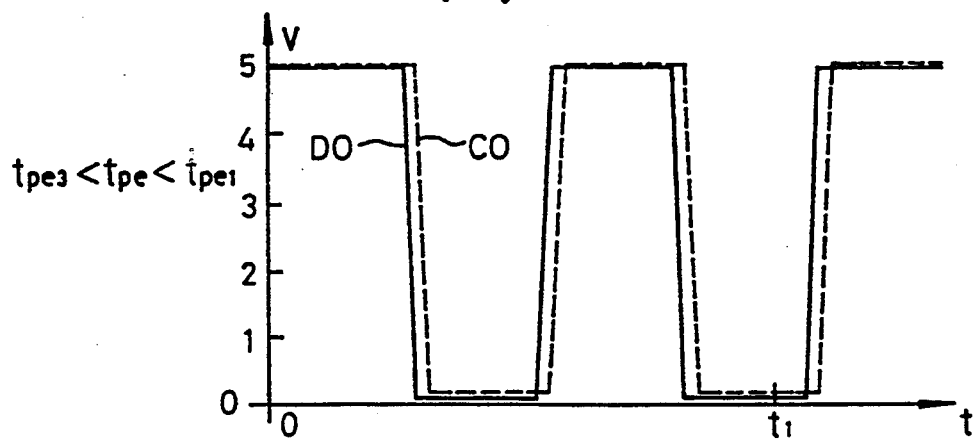
Figure 13C:
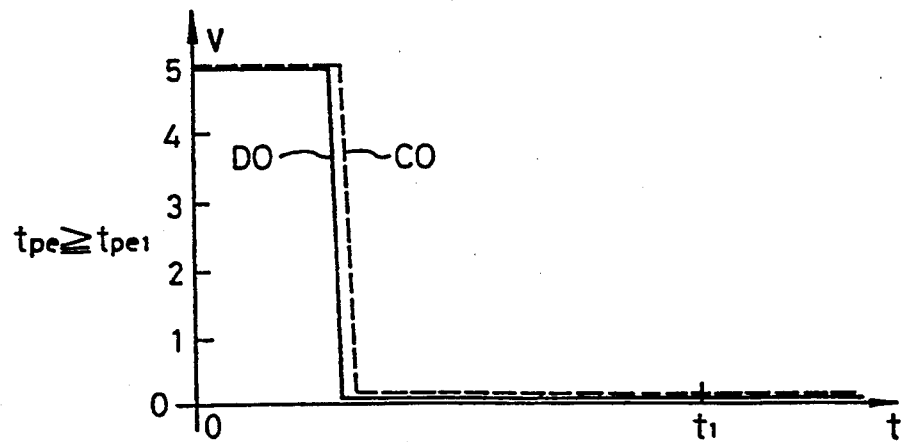

Thus, operation of the comparator detector DA, operation of the filter circuit FIL and operation of the coincidence detection circuit COMP upon verification with respect to the integrated time $t_{pe}$ of an erasure period will be described with reference to FIGS. 8 and 9.

1. When $t_{pe} \leq t_{pe3}$

Since the threshold level $V_{TM}$ Of a memory cell is $V_{TM} \geq V_{TM3} = 3.5$ volts, it satisfies the expression (3) given hereinabove in connection with the conventional flash EEPROM, and accordingly, the comparators detector DA determines that the memory cell is in a written condition ("0") and outputs the "H" level at the output DO thereof. Consequently, as seen from FIG. 4(A), the "H" level is outputted at the output FO of the filter circuit FIL and the output CO of the coincidence detection circuit COMP.

2. When $t_{pe3} < t_{pe} < t_{pe1}$

Since the threshold level $V_{TM}$ Of the memory cell is $3.0$ volts $< V_{TM} < 3.5$ volts, it satisfies the expression (5) given hereinabove In connection with the conventional flash EEPROM, and accordingly, the comparator detector DA cannot detect whether the stored information of the memory cell is "0" or "1" and the output DO thereof exhibits such an oscillation condition as seen from FIG. 4(B).

While an oscillation phenomenon is caused by noise which is produced by switching of a MOSFET or the like as described hereinabove in connection with the conventional flash EEPROM, it is caused as such noise is fed back by way of a power source line or a grounding line to a circuit having a highest sensitivity which normally is a sense amplifier circuit or a comparator detector. The circuit to which the noise has been fed back is rendered unstable, and consequently, it enters a condition wherein the output thereof is not definite between "0" and "1".

The cycle time of such oscillations normally has a value lower than twice the reading speed in a read mode. This is because the circuit at a location where there is a signal path upon reading makes a noise source while a node of the circuit at the location receives the noise and exhibits a potential variation, as a result of which the circuit is switched to feed back the noise, resulting in an oscillation condition. Accordingly, the cycle time of oscillations can be estimated from the beginning of designing.

For example, in the case of a product which is designed so as to have a reading speed of 200 ns, the cycle time of oscillations can be considered to be less than 400 ns. Or in other words, the width of an oscillation pulse can be estimated to be less than 200 ns.

However, since generally a design margin is assured, upon designing of the filter circuit FIL, for example, in the case of the present example, the maximum value of the width of oscillation pulses which can be removed is designed to be approximately 300 ns. The circuit shown in FIG. 2(A) is obtained as a result of such designing.

Where the W/L of each of the MOSFETs $Q_{F1}$, $Q_{F2}$, $Q_{F3}$ and $Q_{F4}$ is designed in such a manner as described above, for example, where $C_{F1}=2_{PF}$ and $C_{F2}=1$ PF, then oscillation pulses of cycle times shorter than 300 ns can be removed. The reason will be described subsequently.

Figure 3A:
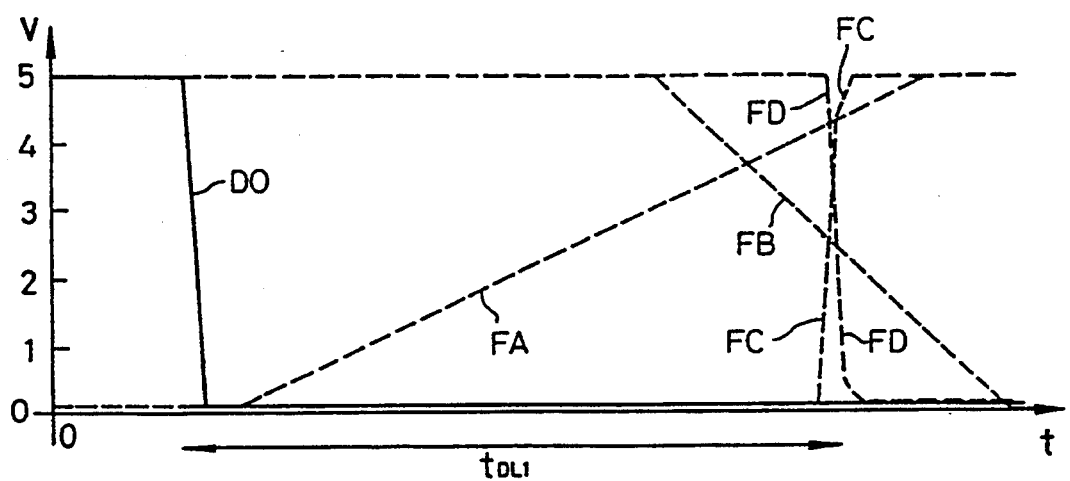
FIGS. 3(A) and 3(B) are waveform diagrams of outputs of different nodes of the filter circuit of FIG. 2(A) with respect to an input to the filter circuit when the input varies from the "H" level to the "L" level and from the "L" level to the "H" level, respectively.
Figure 3B:
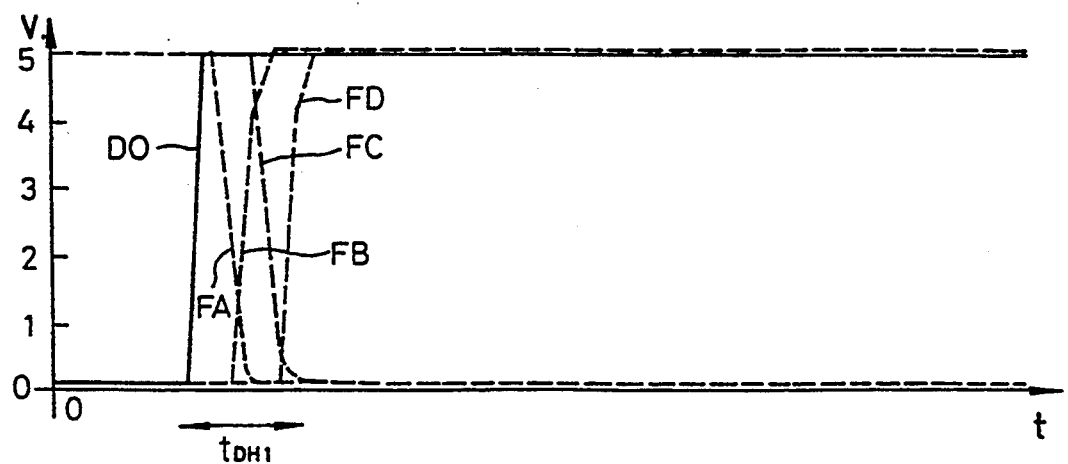

FIGS. 3(A) and 3(B) illustrates the variations of waveforms at different nodes of the circuit of FIG. 2(A) when the input DO varies from the "H" level to the "L" level and from the "L" level to the "H" level, respectively. When the input DO varies from the "H" level to the "L" level, since the current driving capacity of the MOSFET $Q_{F1}$ is designed low, the voltage at a node FA rises with a time constant defined by an equivalent resistance value $RQ_{F1}$ of the MOSFET $Q_{F1}$ and the capacitance value of the capacitor $C_{F1}$.

As the voltage at the node FA rises until the MOSFET $Q_{F4}$ conducts, since the current driving capacity of the MOSFET $Q_{F4}$ is designed low, the voltage at another node FB drops with a time constant defined by an equivalent resistance value $RQ_{F4}$ of the MOSFET $Q_{F1}$ and the capacitance value of the capacitor $C_{F2}$.

When the voltage at the node FB drops to a threshold level value of the inverter circuit $INVF_1$, the voltage level at another node FC varies from "L" to "H" while the voltage level at a further node FD varies from "H" to "L". As a result, when the input DO varies from the "H" level to the "L" level, the output FO varies from the "H" level to the "L" level after the delay of a delay time $t_{DL1}$. In other words, even if the input DO varies from the "H" level to the "L" level, the data variation from the "H" level to the "L" level is not transmitted to the output FO before the time $t_{DL1}$ elapses. In the case of the present example, the delay time $t_{DL1}$ is designed to be $t_{DL1}=300$ ns as described hereinabove.

In contrast, when the input DO varies from the "L" level to the "H" level, since the current driving capacity of the MOSFET $Q_{F2}$ is designed sufficiently higher than the current driving capacity of the MOSFET $Q_{F1}$, the MOSFET $Q_{F2}$ conducts in response to the variation from the "L" level to the "H" level, and consequently, the node FA immediately varies from the "H" level to the "L" level. Further, since the current driving capacity of the MOSFET $Q_{F3}$ is designed sufficiently higher than the current driving capacity of the MOSFET $Q_{F4}$, when the MOSFET $Q_{F3}$ conducts, the node FB immediately varies from the "L" level to the "H" level; the node FC immediately varies from the "H" level to the "L" level; and the node FD immediately varies from the "L" level to the "H" level. As a result, after the delay of a delay time $t_{DH1}$ after the variation of the input DO from the "L" level to the "H" level, the output FO varies from the "L" level to the "H" level.

The delay time $t_{DH1}$ is sufficiently shorter than the delay time $t_{DL1}$ as apparently seen from FIG. 3 and is, for example, 5 ns.

Figure 4A:
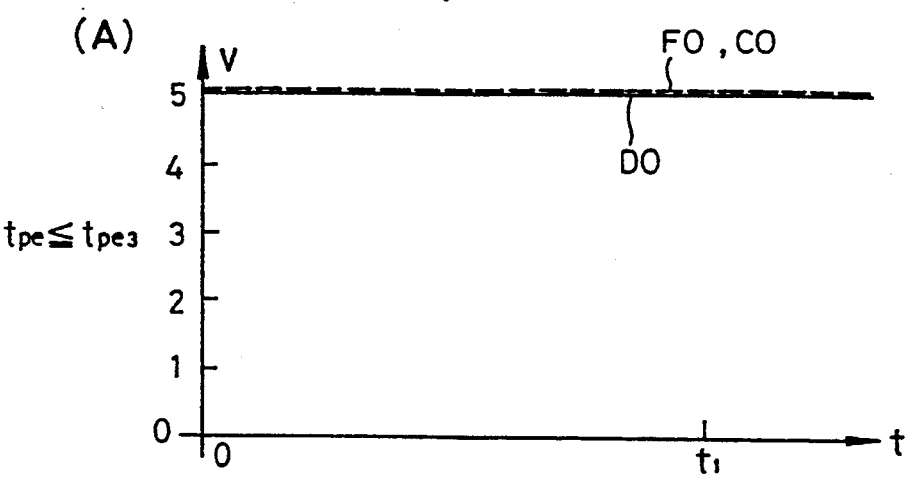
FIGS. 4(A), 4(B) and 4(C) are waveform diagrams of outputs of different nodes of the nonvolatile semiconductor memory device of FIG. 1 upon verification in an erasure operation when the integrated time $t_{pe}$ of an erasure period is $t_{pe} \leq t_{pe3}$, $t_{pe3} < t_{pe} < t_{pe1}$ and $t_{pe} \leq t_{pe1}$, respectively.
Figure 4B:
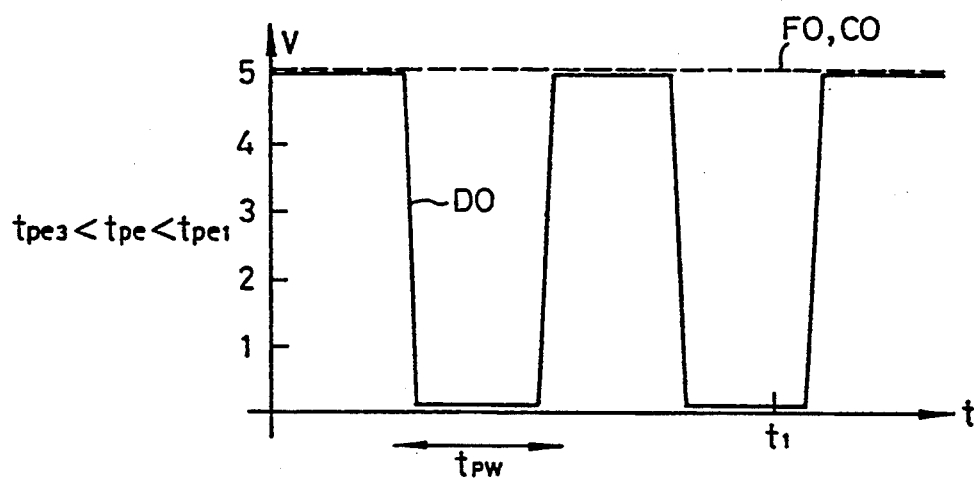
Figure 4C:
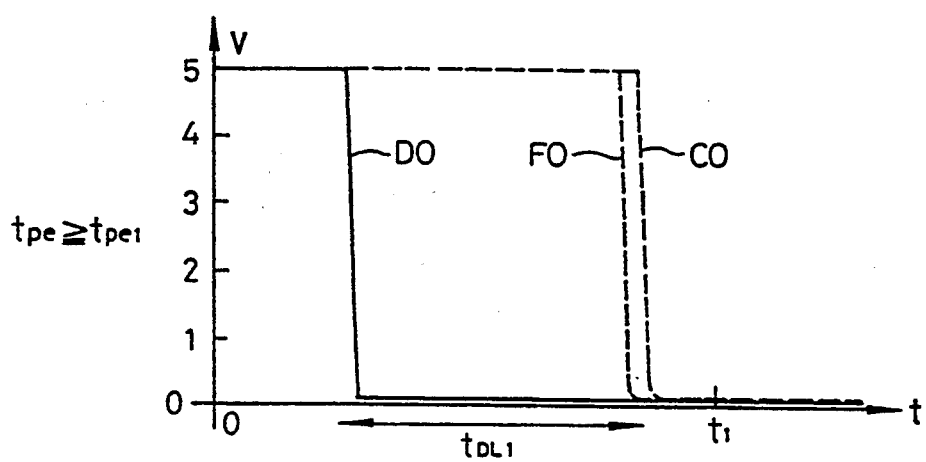

Accordingly, even if the output DO of the comparator detector DA is put into an oscillation condition as seen from FIG. 4(B), since the filter circuit FIL is designed so that a pulse width $t_{pw}$ of oscillations shown in FIG. 4(B) is $t_{pw}<t_{DL1}$, the "H" level is outputted at both of the output FO of the filter circuit FIL and the output CO of the coincidence detection circuit COMP, and consequently, oscillation pulses having cycle times shorter than 800 ns can be removed.

3. When $t_{pe} \geq t_{pe1}$

Since the threshold level $V_{TM}$ Of the memory cell is $V_{TM} \leq V_{TM1} = 3.0$ volts, it satisfies the expression (4) given hereinabove in connection with the conventional flash EEPROM, and accordingly, the comparator detector DA determines that the memory cell is in a sufficiently erased condition ("1"). Consequently, the output DO of the comparator detector DA varies from the "H" level to the "L" level and such variation is transmitted to the filter circuit FIL. Consequently, the output FO of the filter circuit FIL varies from the "H" level to the "L" level after lapse of the delay time $t_{DL1}$ as described hereinabove in item 2, and as a result, also the output CO of the coincidence detection circuit COMP varies from the "H" level to the "L" level.

Upon verification, it is detected by the comparator detector DA whether a memory cell is in a written condition ("0") or in a sufficiently erased condition ("1"). However, when the threshold level of the memory cell is within its transition region between the region in which stored Information can be detected as "0" and the region In which stored information can be detected as "1", the comparator detector DA is disabled to detect and the output of it exhibits an oscillation condition.

Where the flash EEPROM of FIG. 1 includes the filter circuit FIL shown in FIG. 2(A), since oscillation waveforms of the output of the comparator detector DA can be removed, there is no possibility that an oscillation condition of the output of the comparator detector DA1 determined as completion of erasure by the coincidence detection circuit COMP in error.

Figure 2B:
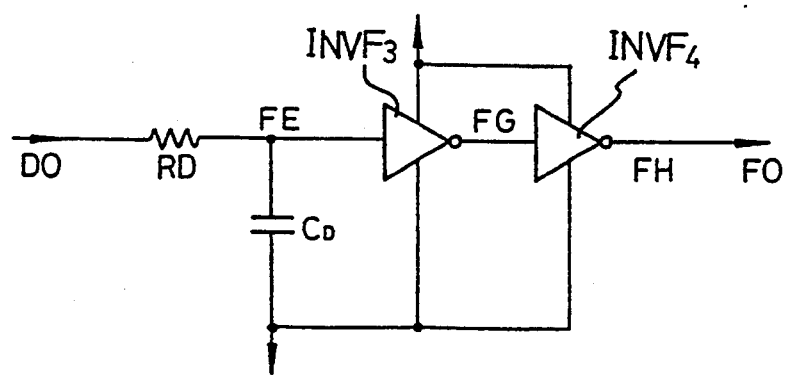

FIG. 2(B) shows a second exemplary construction of the filter circuit FIL. The filter circuit of FIG. 2(B) includes a resistor RD formed from a diffused resistor, an ion Implantation resistor or polycrystalline silicon, a capacitor CD formed from a gate capacitor or the like, and a pair of inverter circuits $INVF_3$ and $INVF_4$.

Figure 5A:
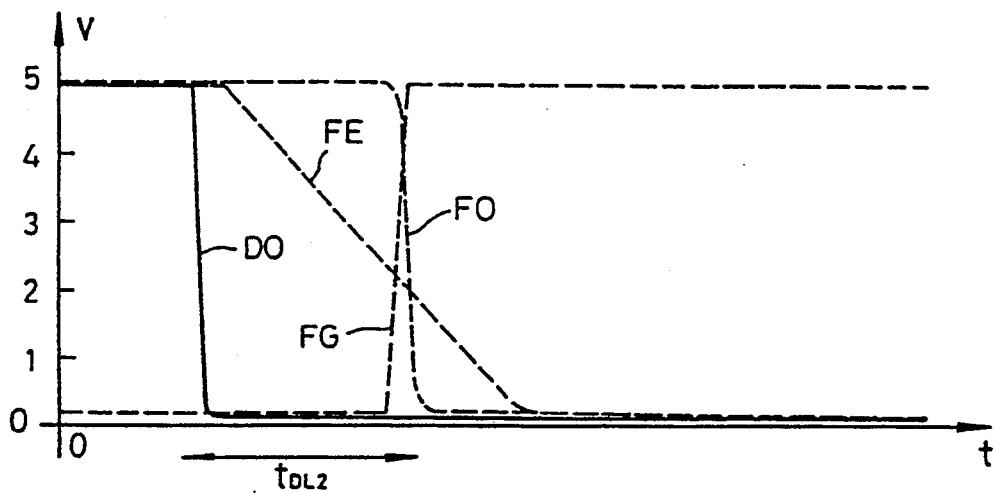
FIGS. 5(A) and 5(B) are waveform diagrams of outputs of different nodes of the filter circuit of FIG. 2(B) with respect to an input when the input varies from the "H" level to the "L" level and from the "L" level to the "H" level, respectively.
Figure 5B:
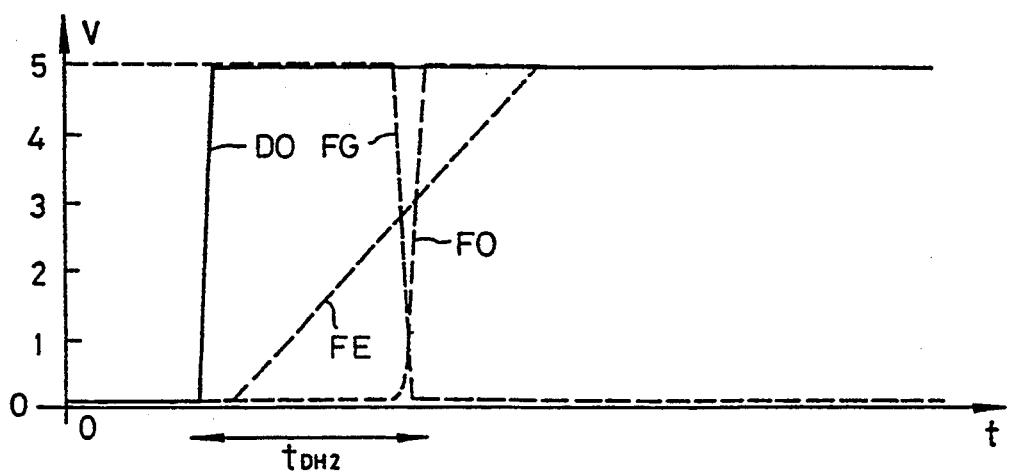

FIGS. 5(A) and 5(B) illustrates the variations of waveforms at different nodes of the filter circuit FIL of FIG. 2(B) when the input DO varies from the "H" level to the "L" level and from the "L" level to the "H" level, respectively. When the input DO varies from the "H" level to the "L" level, also a node FE varies from the "H" level to the "L" level with a time constant defined by the resistance value of the resistor RD and the capacitance value of the capacitor CD.

In this Instance, when the voltage at the node FE drops to the logic threshold level of the inverter circuit $INVF_3$, the output FG of the inverter circuit $INVF_3$ varies from the "L" level to the "H" level and the output FH of the inverter circuit $INVF_4$ varies from the "H" level to the "L" level. As a result, when the input DO varies from the "H" level to the "L" level, the output FO of the filter circuit FIL varies from the "H" level to the "L" level after the delay of a delay time $t_{DL2}$.

In contrast, when the input DO varies from the "L" level to the "H" level, also the node FE varies similarly from the "L" level to the "H" level. When the voltage at the node FE rises to the logic threshold level of the inverter circuit $INVF_3$, the output FG of the inverter circuit $INVF_3$ varies from the "H" level to the "L" level and the output FH of the inverter circuit $INVF_4$ varies from the "L" level to the "H" level. As a result, after the input DO varies from the "L" level to the "H" level, the output FO of the filter circuit FIL varies from the "L" level to the "H" level after the delay of the delay time $t_{DL2}$.

The second filter circuit shown in FIG. 2(B) is different from the first filter circuit shown in FIG. 2(A) in that, whether the input varies from the "H" level to the "L" level or from the "L" level to the "H" level, the voltage at the node FE varies with a time constant defined by the resistance value of the resistor RD and the capacitance value of the capacitor CD, and the value of the delay time $t_{DH2}$ cannot be set so low as the value of the delay time $t_{DH1}$ set in the first filter circuit. In this instance, if the logic threshold level of the inverter circuit $INVF_3$ is set to $V_{cc}/2$, then the delay time $t_{DH2}$ becomes substantially equal to the delay time $t_{DL2}$, but if the logic threshold level of the inverter circuit $INVF_3$ is set sufficiently higher than $V_{cc}/2$, then $t_{DH2} > t_{DL2}$ is established. However, if the logic threshold level of the inverter circuit $INVF_3$ is set sufficiently lower than $V_{cc}/2$, then $t_{DH2} < t_{DL2}$ is established.

In order to make the value of the delay time $t_{DL2}$ substantially equal to the value of the delay time $t_{DL1}$ in the first filter circuit, the resistance value of the resistor RD and the capacitance value of the capacitor DC should be designed so that, when the voltage at the node FE varies from the "H" level to the "L" level, the time required to reach the logic threshold level of the inverter circuit $INVF_3$ may be equal to the delay time $t_{DL1}$.

Accordingly, also in the second filter circuit, when the output DO of the comparator detector DA varies from the "H" level to the "L" level, the output FO of the filter circuit varies from the "H" level to the "L" level after the delay of the delay time $t_{DL2}$. Accordingly, upon verification, the second filter circuit operates similarly to the first filter circuit. Thus, by designing the delay time $t_{DL2}$ and the time $t_{pw}$ so that $t_{DL2} > t_{pw}$, oscillation waveforms of the output DO of the comparator detector DA can be removed by the filter circuit FIL shown in FIG. 2(B) and prevented from being transmitted to the coincidence detection circuit COMP at the next stage. Consequently, similar effects to those described hereinabove in connection with the first filter circuit can be achieved.

While the construction of the flash EEPROM according to the present invention which is effective upon verification In an erasure operation (FIG. 1) is described above, the present invention can be applied also to another construction which is effective upon reading. Such construction is shown as a second embodiment of the present invention in FIG. 6.

Figure 6:
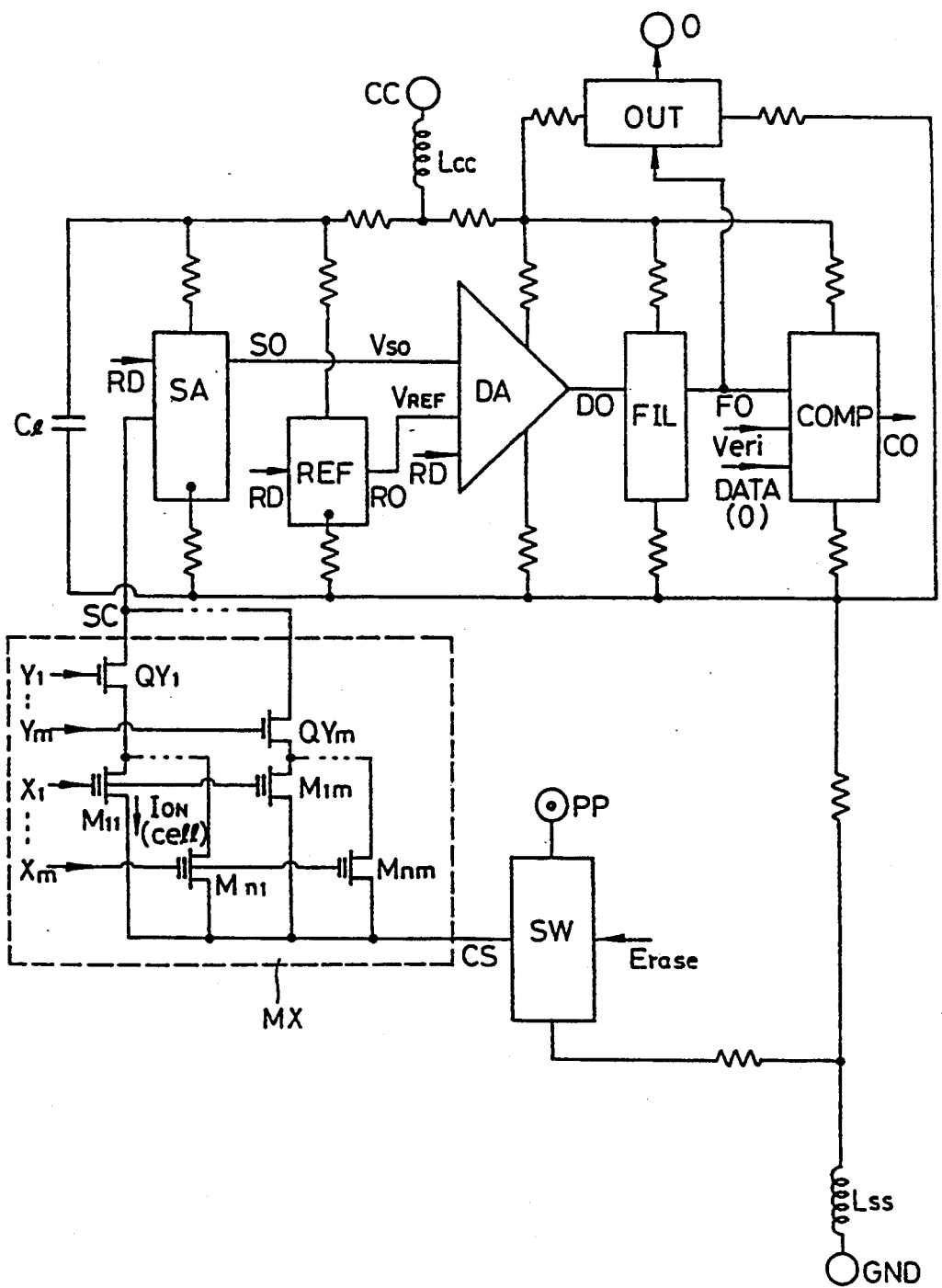
FIG. 6 is a circuit block diagram of another nonvolatile semiconductor memory device showing a second preferred embodiment of the present invention.

Referring to FIG. 6, also in the flash EEPROM of the present embodiment shown, a filter circuit FIL is interposed between the output DO of the comparator detector DA and the input of the output buffer circuit OUT. Consequently, an oscillation condition of the output of the comparator detector DA is prevented from being transmitted to the output buffer circuit OUT as the output of the comparator detector DA passes the filter circuit FIL, and the output of the output buffer circuit out can be fixed to the "H" level or the "L" level. Accordingly, there is an advantage in that the nonvolatile semiconductor memory device can be constructed so as to reduce noise.

Further, while the filter circuits having the constructions shown in FIGS. 2(A) and 2(B) are listed as examples of the filter circuit of the flash EEPROM, a filter circuit of any construction may be effectively employed in the present invention only if it is constructed so as to obtain an output signal delayed intentionally by a fixed interval of time with respect to an input signal.

Furthermore, while verification in an erasure operation is described in the embodiments of the present invention, similar effects can be achieved by applying the present Invention to verification in a writing operation, and the present invention can be applied effectively to verification In a writing operation.

Having now fully described the invention, it will be apparent to one of ordinary skill in the art that many changes and modifications can be made thereto without departing from the spirit and scope of the invention as set forth herein.

What is claimed is:

1. A nonvolatile semiconductor memory device, comprising:
   an electrically reloadable nonvolatile semiconductor memory element;
   sense amplifier means for reading and amplifying stored information of said memory element;
   comparison means for comparing an output level of said sense amplifier means with a reference level;
   low-pass filter means for receiving a comparison output of said comparison means as an input thereto; and
   coincidence detection means for comparing a filter output of said low-pass filter means with a predetermined logic value to detect a coincidence condition between them to detect a storage condition of information of said nonvolatile semiconductor memory element.

2. A nonvolatile semiconductor memory device as claimed in claim 1, further comprising buffer means for leading out the output of said low-pass filter means to the outside of said nonvolatile semiconductor memory device.

3. A nonvolatile semiconductor memory device as claimed In claim 1, wherein said low-pass filter means includes a delay circuit for delaying a variation of the comparison output of said comparison means inputted thereto.

4. A nonvolatile semiconductor memory device as claimed in claim 3, wherein said delay circuit includes a first inverter for receiving the comparison output of said comparison means as an Input thereto, a second inverter for receiving an output of said first inverter as an input thereto, and a capacitor provided at each of outputs of said first and second inverters.

5. A nonvolatile semiconductor memory device as claimed in claim 3, wherein said delay circuit is a time constant circuit which receives the comparison output of said comparison means as an input thereto and includes a resistor and a capacitor.

* * * * *